US012451447B2

(12) United States Patent
Chen et al.

(10) Patent No.: US 12,451,447 B2
(45) Date of Patent: Oct. 21, 2025

(54) SUBSTRATE EMBEDDED WITH INTEGRATED INDUCTOR AND MANUFACTURING METHOD THEREOF

(71) Applicant: Zhuhai ACCESS Semiconductor Co., Ltd., Guangdong (CN)

(72) Inventors: Xianming Chen, Guangdong (CN); Xiaowei Xu, Guangdong (CN); Juchen Huang, Guangdong (CN); Benxia Huang, Guangdong (CN); Gao Huang, Guangdong (CN)

(73) Assignee: Zhuhai ACCESS Semiconductor Co., Ltd., Guangdong (CN)

( * ) Notice: Subject to any disclaimer, the term of this patent is extended or adjusted under 35 U.S.C. 154(b) by 412 days.

(21) Appl. No.: 18/175,527

(22) Filed: Feb. 27, 2023

(65) Prior Publication Data
US 2023/0361058 A1 Nov. 9, 2023

(30) Foreign Application Priority Data

May 6, 2022 (CN) .......................... 202210490230.5

(51) Int. Cl.
*H01L 23/64* (2006.01)
*H01L 21/48* (2006.01)
*H01L 23/498* (2006.01)

(52) U.S. Cl.
CPC ........ *H01L 23/645* (2013.01); *H01L 21/4857* (2013.01); *H01L 23/49822* (2013.01)

(58) Field of Classification Search
CPC ............... H01L 23/645; H01L 21/4857; H01L 23/49822; H01F 17/04; H01F 41/046;
(Continued)

(56) References Cited

U.S. PATENT DOCUMENTS

2016/0196906 A1    7/2016  Kim et al.
2019/0304661 A1*  10/2019  Xu ..................... H01F 17/0006
2020/0066627 A1    2/2020  Do et al.

FOREIGN PATENT DOCUMENTS

CN         101778539 A        7/2010
CN         104465329 A        3/2015
(Continued)

OTHER PUBLICATIONS

First Search Report for CN Application No. 2022104902305 and English translation, mailed Jan. 29, 2023, 6 pages.
(Continued)

*Primary Examiner* — Tucker J Wright
(74) *Attorney, Agent, or Firm* — Buchalter; Jason W. Croft

(57) ABSTRACT

A manufacturing method for a substrate embedded with integrated inductor includes: providing a bearing plate; manufacturing a first conduction copper column on the bearing plate; arranging a first dielectric layer on the bearing plate which covers the first conduction copper column; opening the first dielectric layer to form a first opening; filling a magnetic material at the first opening; grinding the first dielectric layer so that surfaces of the first conduction copper column and the magnetic material are flush with a surface of the first dielectric layer; removing the bearing plate, etching a metal layer on the surface of the first dielectric layer to form a package substrate; arranging a first circuit layer and a solder mask layer on an upper surface and a lower surface of the package substrate; and forming a window in the solder mask layer corresponding to the first circuit layer.

10 Claims, 8 Drawing Sheets

(58) Field of Classification Search
CPC .. H01F 17/0013; H01F 17/0006; H01F 27/24; H01F 27/2804; H01F 41/02; H01F 41/041; H01F 17/00; H01F 27/28; H01F 41/04

See application file for complete search history.

(56) References Cited

FOREIGN PATENT DOCUMENTS

| | | | |
|---|---|---|---|
| CN | 105989988 | B | 10/2016 |
| CN | 107408513 | A | 11/2017 |
| CN | 111554639 | A | 8/2020 |
| CN | 112382574 | A | 2/2021 |
| CN | 113053849 | A | 6/2021 |
| CN | 113327909 | A | 8/2021 |
| JP | 2002111223 | A | 4/2002 |
| JP | 2003188338 | A | 7/2003 |
| JP | 2016136556 | A | 7/2016 |
| JP | 2017069523 | A | 4/2017 |
| JP | 2019134141 | A | 8/2019 |
| JP | 2021052076 | A | 4/2021 |
| JP | 2021129067 | A | 9/2021 |
| JP | 2021141311 | A | 9/2021 |
| TW | 202037238 | A | 10/2020 |

OTHER PUBLICATIONS

First Office Action for CN Application No. 2022104902305 and English translation, mailed Jan. 30, 2023, 10 pages.

Second Office Action for CN Application No. 2022104902305 and English translation, mailed Mar. 30, 2023, 12 pages.

Search Report for JP Application No. 2023029581 and English translation, mailed Mar. 22, 2024, 28 pages.

First Office Action for JP Application No. 2023029581 and English translation, mailed May 7, 2024, 6 pages.

Decision of Rejection for JP Application No. 2023029581 and English translation, mailed Dec. 3, 2024, 6 pages.

First Office Action for KR Application No. 10-2023-0028634 and English translation, mailed Aug. 27, 2024, 14 pages.

Second Office Action for KR Application No. 10-2023-0028634 and English translation, mailed Feb. 27, 2025, 19 pages.

Search Report for TW Application No. 112103987 and English translation, mailed May 21, 2023, 3 pages.

First Office Action for TW Application No. 112103987 and English translation, mailed May 24, 2023, 13 pages.

Decision of Rejection for CN Application No. 2022104902305 and English translation, mailed Jun. 7, 2023, 12 pages.

* cited by examiner

SUBSTRATE EMBEDDED WITH INTEGRATED INDUCTOR AND MANUFACTURING METHOD THEREOF

CROSS-REFERENCE TO RELATED APPLICATION

This application is filed on the basis of Chinese patent application No. 2022104902305 filed May 6, 2022, and claims priority of the Chinese patent application, the entire contents of which are incorporated herein by reference.

TECHNICAL FIELD

The disclosure relates to the technical field of semiconductor packaging, in particular to a substrate embedded with integrated inductor and a manufacturing method thereof.

BACKGROUND

The traditional integrated inductor manufacturing process includes winding a finished coil, implanting the same into a magnetic cavity, and filling the magnetic cavity with a magnetic material. After curing, the magnetic material and the coil form an integrated inductor. For details, reference may be made to Chinese patent CN105989988B. However, in this manufacturing process, the combined size tolerance due to coil placement and magnetic cavity manufacturing and alignment is large, which cannot realize miniaturization. Moreover, it is difficult to lead out the coil for conductive connection and alignment with substrate wiring, which ultimately leads to a low yield.

SUMMARY

The disclosure aims to solve at least one of the technical problems in the existing technology. To this end, the disclosure provides a substrate embedded with integrated inductor and a manufacturing method thereof. The substrate embedded with integrated inductor can reduce combined tolerance in process sizes, which is beneficial to miniaturization.

In one aspect, a manufacturing method for a substrate embedded with integrated inductor is provided according to embodiments of the disclosure, including:
  providing a bearing plate, wherein a metal layer is arranged on a surface of the bearing plate;
  arranging a first conduction copper column on the surface of the bearing plate;
  arranging a first dielectric layer on the surface of the bearing plate, which covers the first conduction copper column;
  opening the first dielectric layer to form a first opening;
  filling a magnetic material at the first opening;
  grinding the first dielectric layer so that a surface of the first conduction copper column and a surface of the magnetic material are flush with a surface of the first dielectric layer;
  removing the bearing plate, and etching the metal layer on the surface of the first dielectric layer to form a package substrate;
  arranging a first circuit layer on an upper surface and a lower surface of the package substrate; and
  arranging a solder mask layer on the upper surface and the lower surface of the package substrate, and forming a window in the solder mask layer corresponding to the first circuit layer.

According to some embodiments of the disclosure, the metal layer comprises a stack of a first copper layer, a second copper layer and an etching barrier layer, wherein the first copper layer and the second copper layer is capable of being physically separated from each other.

According to some embodiments of the disclosure, removing the bearing plate, and etching the metal layer on the surface of the first dielectric layer to form a package substrate comprises:
  separating the first copper layer from the second copper layer, and removing the bearing plate; and
  etching the second copper layer and the etching barrier layer on the surface of the first dielectric layer to form the package substrate.

According to some embodiments of the disclosure, before removing the bearing plate, and etching the metal layer on the surface of the first dielectric layer to form a package substrate, the method further comprises:
  arranging a second circuit layer on the surface of the first dielectric layer which is connected to the first conduction copper column;
  arranging a second conduction copper column on the second circuit layer;
  arranging a second dielectric layer on the surface of the first dielectric layer, which covers the second conduction copper column;
  opening the second dielectric layer to form a second opening;
  filling the magnetic material at the second opening;
  grinding the second dielectric layer so that a surface of the second conduction copper column and the surface of the magnetic material are flush with a surface of the second dielectric layer; and
  repeating the above steps to form multiple dielectric layers.

According to some embodiments of the disclosure, arranging a second circuit layer on the surface of the first dielectric layer which is connected to the first conduction copper column, comprises:
  arranging a first seed layer on the surface of the first dielectric layer;
  arranging a first photoresist layer on the surface of the first seed layer;
  exposing and developing the first photoresist layer to form a third opening; and
  forming the second circuit layer connected to the first conduction copper column at the third opening by means of electroplating.

According to some embodiments of the disclosure, arranging a first conduction copper column on the surface of the bearing plate:
  arranging a second photoresist layer on the surface of the bearing plate;
  exposing and developing the second photoresist layer to form a fourth opening;
  forming the first conduction copper column at the fourth opening by means of electroplating; and
  removing the second photoresist layer.

According to some embodiments of the disclosure, the first dielectric layer is made of a photosensitive material; and opening the first dielectric layer to form a first opening comprises:
  exposing and developing the first dielectric layer to form the first opening.

In another aspect, a substrate embedded with integrated inductor is provided, which is manufactured by the manufacturing method for a substrate embedded with integrated inductor in the above embodiments of the disclosure.

According to some embodiments of the disclosure, the substrate embedded with integrated inductor includes: the package substrate, comprising at least one dielectric layer, wherein the conduction copper column and the magnetic material extending across the dielectric layer are arranged inside the dielectric layer; the first circuit layer, arranged on the upper surface and the lower surface of the package substrate, and connected to the conduction copper column; and the solder mask layer, arranged on the upper surface and the lower surface of the package substrate, wherein the window is formed in the solder mask layer corresponding to the first circuit layer.

According to some embodiments of the disclosure, the package substrate includes multiple dielectric layers, and a second circuit layer is arranged between the conduction copper columns of each two adjacent dielectric layers.

The substrate embedded with integrated inductor and the manufacturing method thereof provided in the embodiments of the disclosure have at least the following beneficial effects. The magnetic material, the conduction copper column and the circuit layer inside the package substrate form an integrated inductor structure. The integrated inductor embedded into the substrate is directly formed in the process of manufacturing the substrate, unlike the traditional method in which the magnetic cavity is made first, and then the finished coil is placed in the magnetic cavity, thereby reducing the combined tolerance in process sizes and shortening the process cycle. Moreover, the integrated inductor is produced synchronously with the wiring and the dielectric on substrate, which improves the accuracy of alignment of the conductive coil of the inductor and the substrate wiring, increases the product yield, reduces the cost, and makes the design size of the inductor more flexible and smaller, thereby achieving miniaturization.

Additional aspects and advantages of the disclosure will be set forth in part in the description which follows, and in part will become obvious from the description, or may be learned by practice of the disclosure.

BRIEF DESCRIPTION OF DRAWINGS

The above and/or additional aspects and advantages of the disclosure will become apparent and comprehensible from the description of the embodiments in conjunction with the following drawings, where.

REFERENCE NUMERAL LISTING

Figure 1:
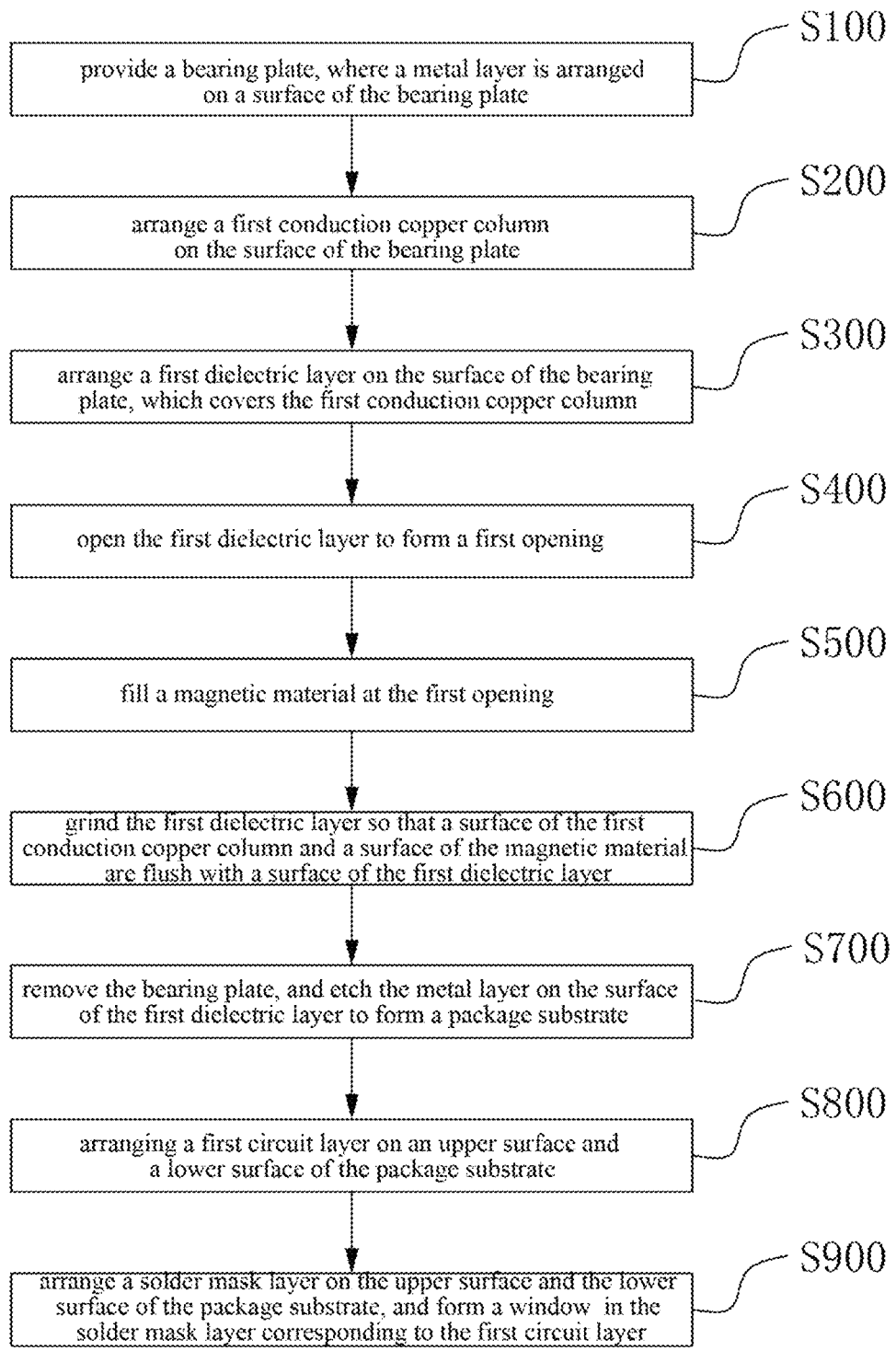
FIG. 1 is a flow chart of steps of a manufacturing method for a substrate embedded with integrated inductor according to an embodiment of the disclosure.

Bearing plate 100, metal layer 110, first copper layer 111, second copper layer 112, etching barrier layer 113, second photoresist layer 200, fourth opening 300, first conduction copper column 400, first dielectric layer 500, first opening 600, magnetic material 700, first seed layer 800, first photoresist layer 900, second circuit layer 1000, third photoresist layer 1100, second conduction copper column 1200, second dielectric layer 1300, third dielectric layer 1400, package substrate 1500, first circuit layer 1600, solder mask layer 1700, and window 1800.

DETAILED DESCRIPTION

This part will describe specific embodiments of the disclosure in detail. The preferred embodiments of the disclosure are shown in the accompanying drawings. The accompanying drawings serve to supplement description of the text part of specification with figures, so that people can intuitively and vividly understand each technical feature and the overall technical solution of the disclosure, which should not be construed as limiting the scope of protection of the disclosure.

In the description of the disclosure, it is to be understood that, when referring to orientation description, the orientation or positional relationships indicated by the terms such as upper, lower, front, rear, left, right, etc., are based on the orientation or positional relationships shown in the drawings, which are merely for ease of description of the disclosure and simplification for the description, rather than indicating or implying that the device or element referred to must have a specific orientation or be constructed and operated in a specific orientation. Therefore, they cannot be construed as limiting the disclosure.

In the description of the disclosure, several refers to one or more; multiple refers to two or more; greater than, less than, over and the like are understood not to include the following number; and above, below, within and the like are understood to include the following number. If described, first and second are only for the purpose of distinguishing between technical features, and not to be construed as indicating or implying relative importance or implicitly indicating the number of technical features indicated or implicitly indicating the precedence relationship of technical features indicated.

In the description of the disclosure, unless explicitly defined otherwise, providing, installing, connecting and other words should be understood broadly, and a person of ordinary skill in the art can reasonably determine the specific meaning of the above words in the disclosure combined with the specific content of the technical solution.

In one aspect, as shown in FIG. 1, a manufacturing method for a substrate embedded with integrated inductor according to embodiments of the disclosure includes the following steps:

Step S100: providing a bearing plate 100, where a metal layer 110 is arranged on a surface of the bearing plate 100.

Figure 2:
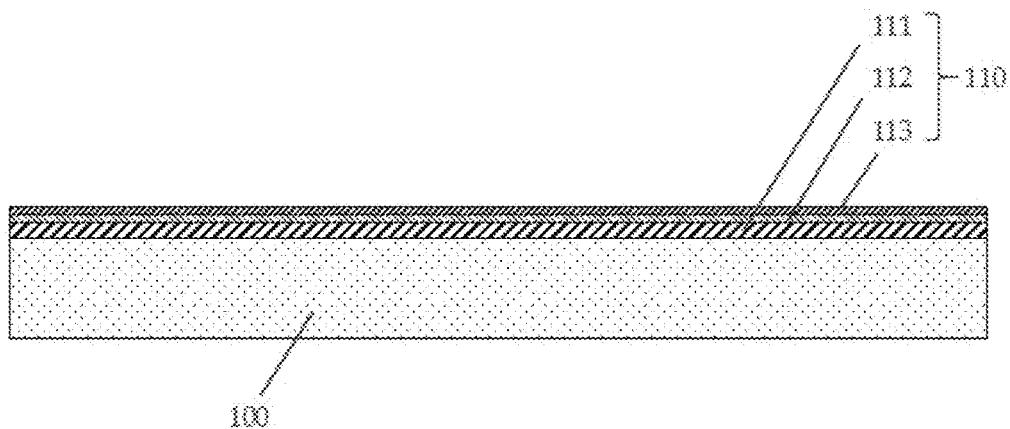
FIG. 2 is a schematic structural diagram of a bearing plate according to an embodiment of the disclosure.

Specifically, as shown in FIG. 2, in this example, a metal layer 110 is arranged on an upper surface of the bearing plate 100. It should be noted that the metal layer 110 may also be arranged on a lower surface of the bearing plate 100. In the disclosure, for convenience of description, only arranging the metal layer 110 on the upper surface of the bearing plated 100 is used as an example for description. More specifically, in some embodiments of the disclosure, the metal layer 110 includes a first copper layer 111, a second copper layer 112 and an etching barrier layer 113, which are sequentially stacked on the surface of the bearing plate 100. The first copper layer 111 and the second copper layer 112 may be physically combined and separated from each other. The etching barrier layer 113 may typically be made of metallic nickel or other etch-resistant metal materials for preventing over-etching when etching the second copper layer 120 later.

Step S200: arranging a first conduction copper column 400 on the surface of the bearing plate 100.

Figure 3:
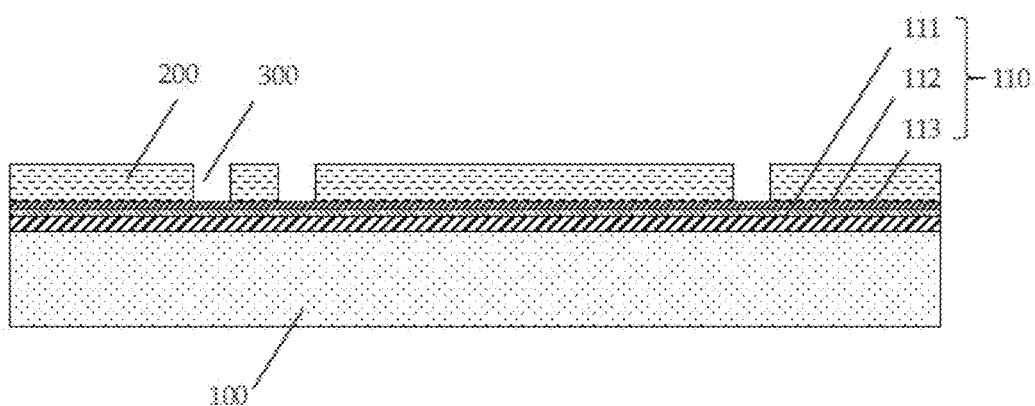
FIG. 3 and FIG. 4 are schematic structural diagrams corresponding to the process of manufacturing a first conduction copper column on the bearing plate.
Figure 4:
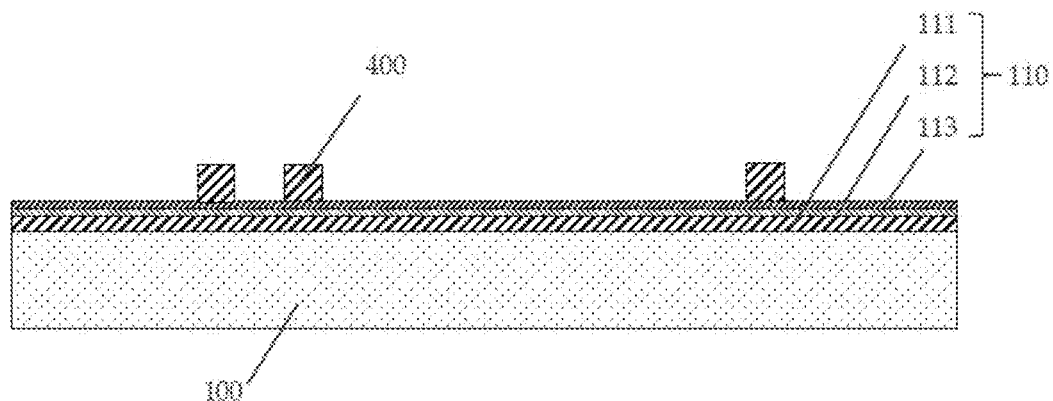

Specifically, in some embodiments of the disclosure, in order to arrange the first conducting copper column 400 on the surface of the bearing plate 100, as shown in FIGS. 3-4, the method further includes the following four steps:

arranging a second photoresist layer 200 on the surface of the bearing plate 100;

exposing and developing the second photoresist layer 200 to form a fourth opening 300;

forming the first conduction copper column 400 at the fourth opening 300 by means of electroplating; and removing the second photoresist layer 200.

The second photoresist layer 200 may be arranged on the surface of the bearing plate 100 by adhesion, and the second photoresist layer 200 is then exposed and developed to form the fourth opening 300. Subsequently, the first conduction copper column 400 is formed at the fourth opening 300 by means of hole filling electroplating.

Figure 5:
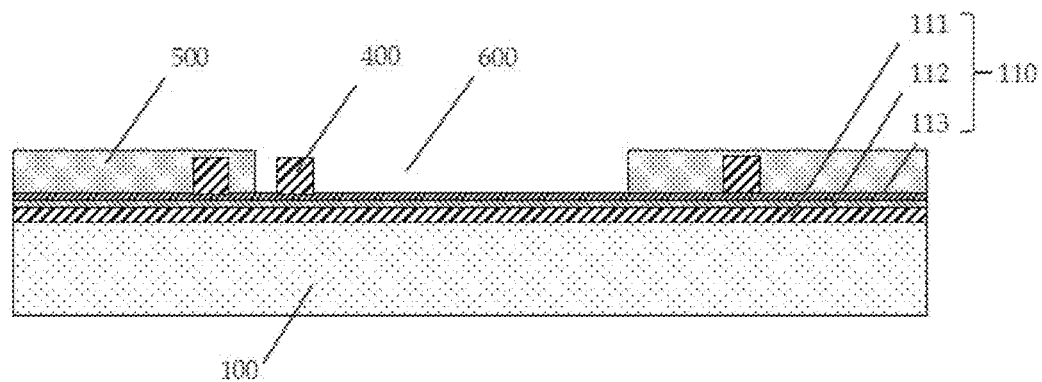
FIG. 5 is a schematic structural diagram after arranging a first dielectric layer on the bearing plate and forming a first opening on the first dielectric layer.

Step S300: arranging a first dielectric layer 500 on the surface of the bearing plate 100, which covers the first conduction copper column 400, as shown in FIG. 5.

Step S400: opening the first dielectric layer 500 to form a first opening 600, as shown in FIG. 5.

Specifically, in some embodiments of the disclosure, in order to open the first dielectric layer 500, the first dielectric layer 500 may use a PID (Photo-Imagable Dielectric) photosensitive material, and the first dielectric layer 500 is arranged on the surface of the bearing plate 100 by means of coating or pressing-fit. Then, the first dielectric layer 500 is exposed and developed to form the first opening 600.

Figure 6:
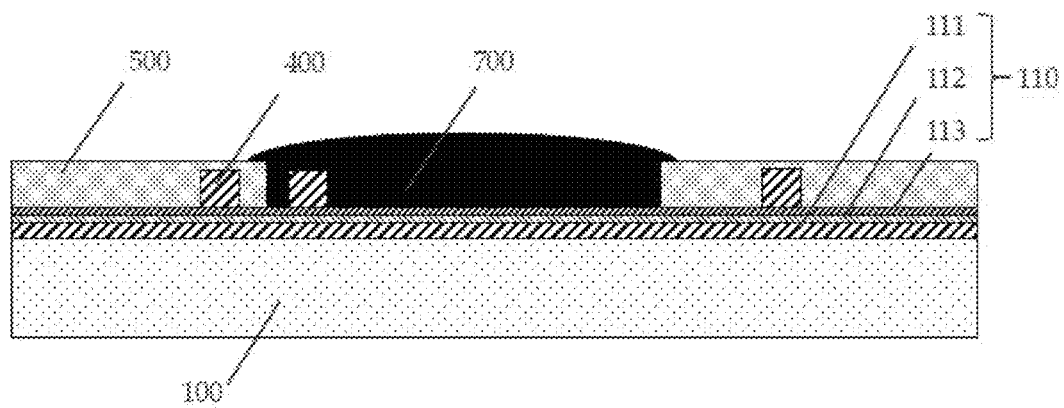
FIG. 6 is a schematic structural diagram after filling a magnetic material at the first opening.

Step S500: filling a magnetic material 700 at the first opening 600, as shown in FIG. 6.

Figure 7:
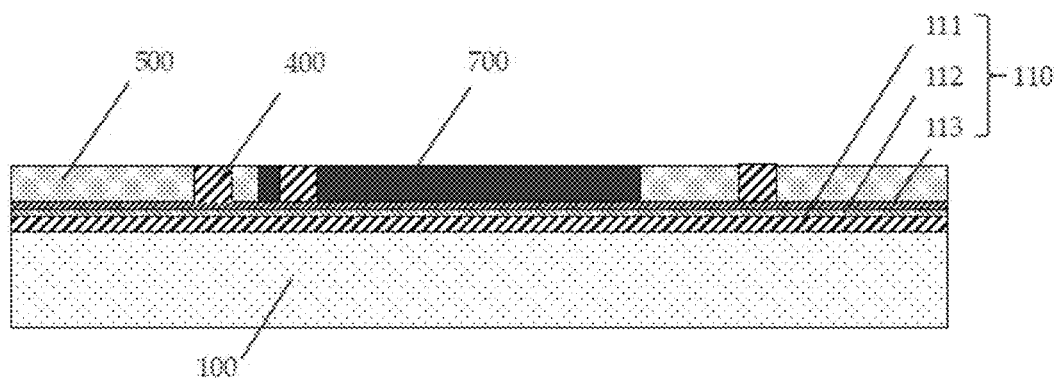
FIG. 7 is a schematic structural diagram after grinding the first dielectric layer.

Step S600: grinding the first dielectric layer 500 so that a surface of the first conduction copper column 400 and a surface of the magnetic material 700 are flush with a surface of the first dielectric layer 500, as shown in FIG. 7.

Mechanical grinding may be used to grind the first dielectric layer 500, so that the surfaces of the first conduction copper column 400 and the magnetic material 700 may both be exposed from the surface of the first dielectric layer 500.

Figure 8:
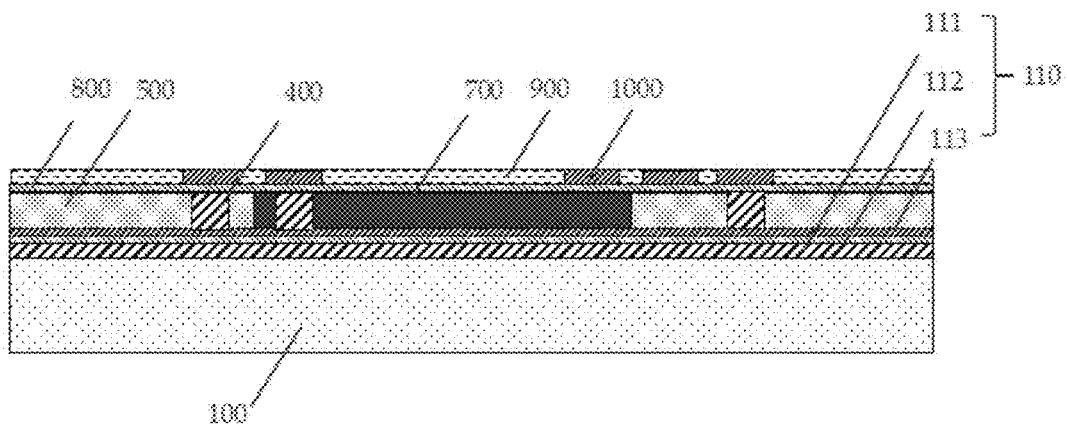
FIG. 8 is a schematic structural diagram after arranging a second circuit layer on a surface of the first dielectric layer.
Figure 9:
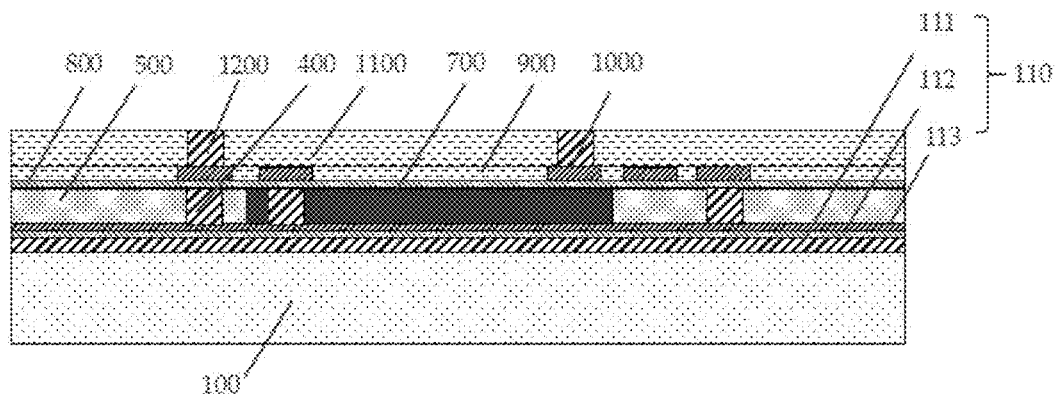
FIG. 9 is a schematic structural diagram after arranging a second conduction copper column on a second circuit layer.
Figure 10:
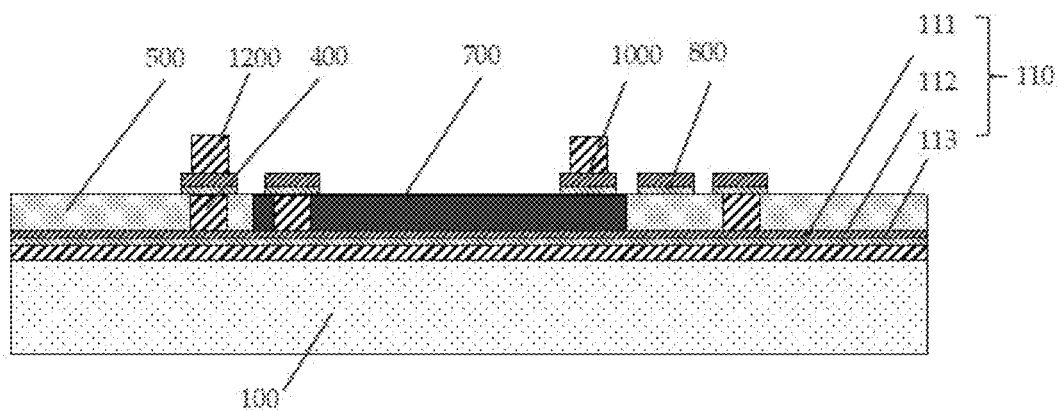
FIG. 10 is a schematic structural diagram after removing a first photoresist layer and a third photoresist layer.
Figure 11:
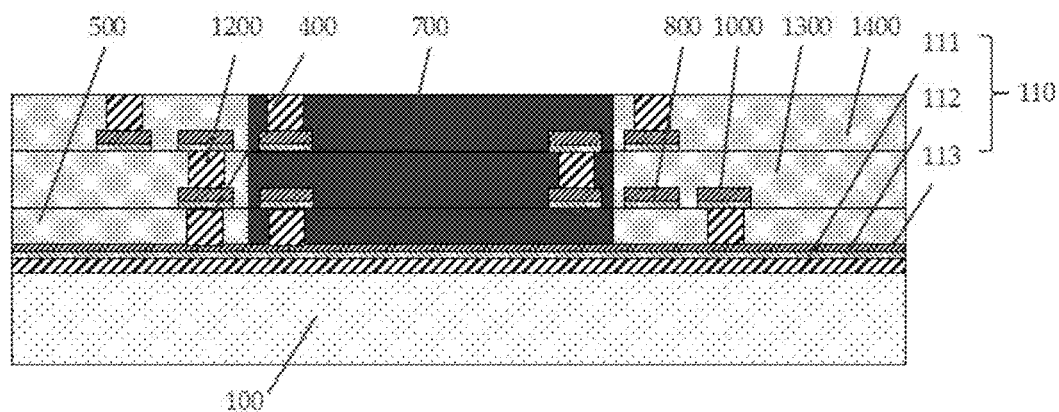
FIG. 11 is a schematic structural diagram after arranging three dielectric layers on the bearing plate.

It should be noted that up to this step, the first dielectric layer 500 and the bearing plate 100 may be separated, and then subsequent circuit manufacturing is performed to form a substrate embedded with integrated inductor. However, in practical applications, in order to meet the actual structural requirements, a build-up manufacturing may also be continued on the first dielectric layer 500, and after forming multiple dielectric layers, the separation may be performed. In order to continue to increase dielectric layers on the first dielectric layer 500, the manufacturing method includes the following steps:

arranging a second circuit layer 1000 on the surface of the first dielectric layer 500, where the second circuit layer 1000 is connected to the first conduction copper column 400, as shown in FIG. 8;

arranging a second conduction copper column 1200 on the second circuit layer 1000, as shown in FIG. 9;

arranging a second dielectric layer 1300 on the surface of the first dielectric layer 500, which covers the second conduction copper column 1200, as shown in FIGS. 10 and 11;

opening the second dielectric layer 1300 to form a second opening (not shown in the figure);

filling the magnetic material 700 at the second opening;

grinding the second dielectric layer 1300 so that a surface of the second conduction copper column 1200 and a surface of the magnetic material 700 are flush with a surface of the second dielectric layer 1300; and if further build-up layer is needed, repeating the above steps to form multiple dielectric layers.

In order to arrange the second circuit layer 1000 on the surface of the first dielectric layer 500, as shown in FIG. 8, the method may include the following steps:

arranging a first seed layer 800 on the surface of the first dielectric layer 500;

arranging a first photoresist layer 900 on a surface of the first seed layer 800;

exposing and developing the first photoresist layer 900 to form a third opening (not shown in the figure); and forming the second circuit layer 1000 at the third opening by means of electroplating, where the second circuit layer 1000 is connected to the first conduction copper column 400.

In order to arrange the second conduction copper column 1200 on the second circuit layer 1000, as shown in FIG. 9, the method may the following steps:

arranging a third photoresist layer 1100 on the first photoresist layer 900;

exposing and developing the third photoresist layer 1100 to form a fifth opening (not shown in the figure);

forming a second conduction copper column 1200 at the fifth opening by means of electroplating, where the second conduction copper column 1200 is connected to the second circuit layer 1000; and removing the first photoresist layer 900 and the third photoresist layer 1100, as shown in FIG. 10.

After the second dielectric layer 1300 is manufactured, a third dielectric layer 1400 or even more dielectric layers may be continuously manufactured on the second dielectric layer 1300 according to the actual needs.

Step S700: removing the bearing plate 100, and etching the metal layer 110 on the surface of the first dielectric layer 500 to form a package substrate 1500.

Figure 12:
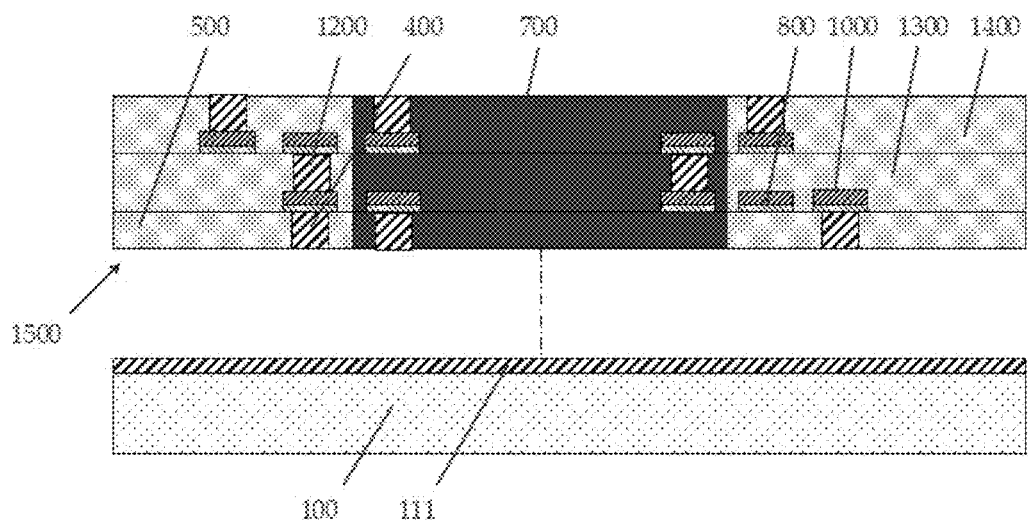
FIG. 12 is a schematic structural diagram after separating the bearing plate from a package substrate.

Specifically, as shown in FIG. 12, after manufacturing of one or more dielectric layers is completed, the first copper layer 111 and the second copper layer 112 are separated by means of physical peeling, thereby removing the bearing plate 100. The second copper layer 112 and the etching barrier layer 130 on the lower surface of the first dielectric layer 500 are then etched away to form a package substrate 1500. The etching barrier layer 130 serves to prevent excessive etching and protect the first conduction copper column 400. The magnetic material 700, the conduction copper columns and the circuit layers inside the package substrate 1500 form the integrated inductor structure.

Figure 13:
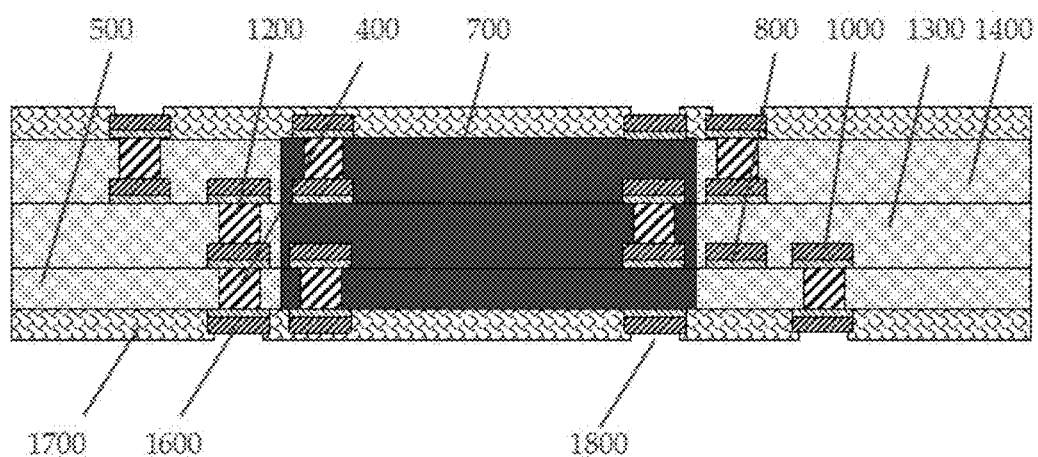
FIG. 13 is a schematic structural diagram of a substrate embedded with integrated inductor according to an embodiment of the disclosure.

Step S800: arranging a first circuit layer 1600 on an upper surface and a lower surface of the package substrate 1500, as shown in FIG. 13.

In order to manufacture the first circuit layer 1600, a layer of titanium copper may be sputtered on the upper surface and the lower surface of the package substrate 1500 as a seed layer. The first circuit layer 1600 is then formed on the seed layer by means of operations of coating photoresist, exposure, development and electroplating, the photoresist film is removed, and the exposed redundant seed layer is etched away.

Step S900: arranging a solder mask layer 1700 on the upper surface and the lower surface of the package substrate 1500, and forming a window 1800 in the solder mask layer 1700 corresponding to the first circuit layer 1600, as shown in FIG. 13.

Specifically, the solder mask layer 1700 may be arranged on the package substrate 1500 by means of silk screen printing, and then the solder mask layer 1700 is exposed and developed to form the window 1800 corresponding to the first circuit layer 1600, where the window 1800 may be used as a pad.

Figure 14:
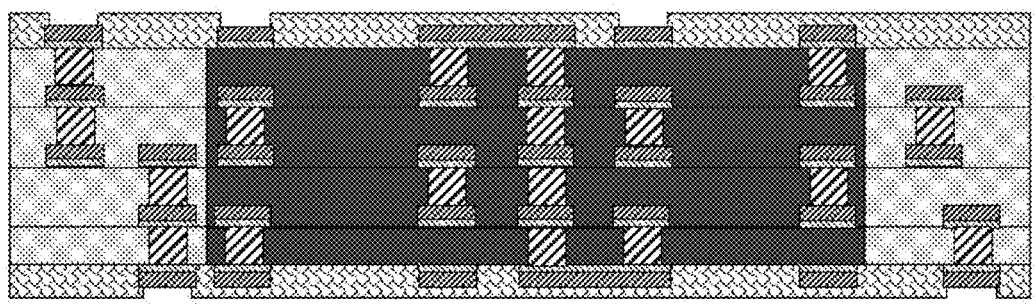
FIG. 14 is a schematic structural diagram of a substrate embedded with integrated inductor according to another embodiment of the disclosure.

As shown in FIG. 13, by using the above manufacturing method, a structure in which an integrated inductor is embedded inside the substrate can finally be formed, and the magnetic material 700, the conduction copper columns and the circuit layers inside the package substrate 1500 form an integrated inductor structure. As shown in FIG. 14, the number of the integrated inductor embedded into the substrate may also be two or even more. That is to say, by using the above manufacturing method, multiple interconnected integrated inductors can be realized by wiring inside or on the surface of the substrate.

It can be seen that, according to the manufacturing method for a substrate embedded with integrated inductor according to the embodiments of the disclosure, the integrated inductor embedded into the substrate is directly formed in the process of manufacturing the substrate, unlike the traditional method in which the magnetic cavity is made first, and then the finished coil is placed in the magnetic cavity, thereby reducing the combined size tolerance in the process and shortening the process cycle. Moreover, the integrated inductor is produced synchronously with the wiring and the dielectric on substrate, which improves the accuracy of alignment of the conductive coil of the inductor and the substrate wiring, increases the product yield, reduces the cost, and makes the design size of the inductor more flexible and smaller, thereby achieving miniaturization.

In another aspect, a substrate embedded with integrated inductor is provided according to embodiments of the disclosure, which is manufactured by the manufacturing method for a substrate embedded with integrated inductor provided in the above embodiments of the disclosure.

In another aspect, the substrate embedded with integrated inductor according to the embodiments of the disclosure, as shown in FIG. 13, includes a package substrate 1500, a first circuit layer 1600, and a solder mask layer 1700, where the package substrate 1500 includes at least one dielectric layer (for example, a first dielectric layer 500, a second dielectric layer 1300, a third dielectric layer 1400, etc. in the figures), and a conduction copper column and a magnetic material 700 extending across the dielectric layer are arranged inside the dielectric layer; the first circuit layer 1600 is arranged on an upper surface and a lower surface of the package substrate 1500, and is connected to the conduction copper column; the solder mask layer 1700 is arranged on the upper surface and the lower surface of the package substrate 1500, and a window 1800 is formed in the solder mask layer 1700 corresponding to the first circuit layer 1600.

According to some embodiments of the disclosure, the package substrate 1500 includes multiple dielectric layers, and a second circuit layer 1000 is arranged between the conduction copper columns of each two adjacent dielectric layers.

The substrate embedded with integrated inductor provided in the embodiments of the disclosure is obtained by using the manufacturing method for a substrate embedded with integrated inductor as described above. The integrated inductor embedded into the substrate is directly formed in the process of manufacturing the substrate, unlike the traditional method in which the magnetic cavity is made first, and then the finished coil is placed in the magnetic cavity, thereby reducing the combined tolerance in process sizes and shortening the process cycle. Moreover, the integrated inductor is produced synchronously with the wiring and the dielectric on substrate, which improves the accuracy of alignment of the conductive coil of the inductor and the substrate wiring, increases the product yield, reduces the cost, and makes the design size of the inductor more flexible and smaller, thereby achieving miniaturization.

The embodiments of the disclosure have been described in detail above in conjunction with the accompanying drawings, but the disclosure is not limited to the above-mentioned embodiments, and within the scope of knowledge of those of ordinary skill in the art, various modifications can be made without departing from the gist of the disclosure.

What is claimed is:

1. A manufacturing method for a substrate embedded with integrated inductor, comprising:
    providing a bearing plate, wherein a metal layer is arranged on a surface of the bearing plate;
    arranging a first conduction copper column on the surface of the bearing plate;
    arranging a first dielectric layer on the surface of the bearing plate, which covers the first conduction copper column;
    opening the first dielectric layer to form a first opening;
    filling a magnetic material at the first opening;
    grinding the first dielectric layer so that a surface of the first conduction copper column and a surface of the magnetic material are flush with a surface of the first dielectric layer;
    removing the bearing plate, and etching the metal layer on the surface of the first dielectric layer to form a package substrate;
    arranging a first circuit layer on an upper surface and a lower surface of the package substrate; and
    arranging a solder mask layer on the upper surface and the lower surface of the package substrate, and forming a window in the solder mask layer corresponding to the first circuit layer.

2. The manufacturing method for a substrate embedded with integrated inductor of claim 1, wherein the metal layer comprises a stack of a first copper layer, a second copper layer and an etching barrier layer, wherein the first copper layer and the second copper layer is capable of being physically separated from each other.

3. The manufacturing method for a substrate embedded with integrated inductor of claim 2, wherein removing the bearing plate, and etching the metal layer on the surface of the first dielectric layer to form a package substrate comprises:

separating the first copper layer from the second copper layer, and removing the bearing plate; and etching the second copper layer and the etching barrier layer on the surface of the first dielectric layer to form the package substrate.

4. The manufacturing method for a substrate embedded with integrated inductor of claim 1, before removing the bearing plate, and etching the metal layer on the surface of the first dielectric layer to form a package substrate, the method further comprises:

arranging a second circuit layer on the surface of the first dielectric layer which is connected to the first conduction copper column;

arranging a second conduction copper column on the second circuit layer;

arranging a second dielectric layer on the surface of the first dielectric layer, which covers the second conduction copper column;

opening the second dielectric layer to form a second opening;

filling the magnetic material at the second opening;

grinding the second dielectric layer so that a surface of the second conduction copper column and the surface of the magnetic material are flush with a surface of the second dielectric layer; and repeating the above steps to form multiple dielectric layers.

5. The manufacturing method for a substrate embedded with integrated inductor of claim 4, wherein arranging a second circuit layer on the surface of the first dielectric layer which is connected to the first conduction copper column, comprises:

arranging a first seed layer on the surface of the first dielectric layer;

arranging a first photoresist layer on the surface of the first seed layer;

exposing and developing the first photoresist layer to form a third opening; and forming the second circuit layer connected to the first conduction copper column at the third opening by means of electroplating.

6. The manufacturing method for a substrate embedded with integrated inductor of claim 1, wherein arranging a first conduction copper column on the surface of the bearing plate:

arranging a second photoresist layer on the surface of the bearing plate;

exposing and developing the second photoresist layer to form a fourth opening;

forming the first conduction copper column at the fourth opening by means of electroplating; and removing the second photoresist layer.

7. The manufacturing method for a substrate embedded with integrated inductor of claim 1, wherein the first dielectric layer is made of a photosensitive material; and opening the first dielectric layer to form a first opening comprises:

exposing and developing the first dielectric layer to form the first opening.

8. A substrate embedded with integrated inductor, which is manufactured by the manufacturing method for a substrate embedded with integrated inductor of claim 1.

9. The substrate embedded with integrated inductor of claim 8, comprising:

the package substrate, comprising at least one dielectric layer, wherein the conduction copper column and the magnetic material extending across the dielectric layer are arranged inside the dielectric layer;

the first circuit layer, arranged on the upper surface and the lower surface of the package substrate, and connected to the conduction copper column; and the solder mask layer, arranged on the upper surface and the lower surface of the package substrate, wherein the window is formed in the solder mask layer corresponding to the first circuit layer.

10. The substrate embedded with integrated inductor of claim 9, wherein the package substrate comprises multiple dielectric layers, and a second circuit layer is arranged between the conduction copper columns of each two adjacent dielectric layers.

\* \* \* \* \*